(12) United States Patent
Barbara et al.

(10) Patent No.: US 7,476,330 B2
(45) Date of Patent: Jan. 13, 2009

(54) LOW TEMPERATURE SUSCEPTIBILITY COMPENSATION

(75) Inventors: Thomas M. Barbara, Mountain View, CA (US); Thomas de Swiet, Redwood City, CA (US)

(73) Assignee: Varian, Inc., Palo Alto, CA (US)

( * ) Notice: Subject to any disclaimer, the term of this patent is extended or adjusted under 35 U.S.C. 154(b) by 773 days.

(21) Appl. No.: 10/669,772

(22) Filed: Sep. 24, 2003

(65) Prior Publication Data

US 2005/0062022 A1    Mar. 24, 2005

(51) Int. Cl.
*H01B 1/06* (2006.01)
*G01V 3/00* (2006.01)

(52) U.S. Cl. ............................ 252/62.51 R; 252/62.57; 252/62.56; 252/500; 252/519.2; 324/321; 324/318; 324/309; 324/305

(58) Field of Classification Search .......... 252/62.51 R, 252/62.54, 62.57, 301.18, 478, 500, 511, 252/518.1; 424/1.65, 9.3–9.4; 600/410; 324/307; 376/272; 372/52

See application file for complete search history.

(56) References Cited

U.S. PATENT DOCUMENTS

| 3,091,732 | A |   | 5/1963  | Anderson et al. |
|-----------|---|---|---------|-----------------|
| 3,377,292 | A | * | 4/1968  | Halverson ............... 252/301.18 |
| 4,615,879 | A | * | 10/1986 | Runge et al. ............... 424/9.32 |
| 4,756,869 | A | * | 7/1988  | Mallener ..................... 376/261 |
| 4,808,326 | A | * | 2/1989  | Tanino et al. ............. 252/62.54 |
| 5,023,072 | A | * | 6/1991  | Cheng ........................ 424/9.32 |
| 5,358,936 | A | * | 10/1994 | Gordon et al. ................. 514/25 |
| 5,545,994 | A |   | 8/1996  | Barbara |
| 5,684,401 | A |   | 11/1997 | Peck et al. |
| 5,705,014 | A |   | 1/1998  | Schenck et al. |
| 6,471,993 | B1 | * | 10/2002 | Shastri et al. ................ 424/486 |
| 6,791,327 | B2 | * | 9/2004  | Skloss ......................... 324/318 |
| 2003/0125576 | A1 | * | 7/2003 | Hofacker et al. ............ 558/265 |

FOREIGN PATENT DOCUMENTS

EP    0 632 284 A1    1/1995
EP    0 676 775 A1    10/1995

OTHER PUBLICATIONS

Zheng et al, "A comparative study on the electroluminesecnce properties of terbium beta-diketonate complexes," J. Mater. chem., 2001, 11, 2615-2619.*

(Continued)

*Primary Examiner*—Stuart Hendrickson
*Assistant Examiner*—Kallambella Vijayakumar
(74) *Attorney, Agent, or Firm*—Bella Fishman; Edward H. Berkowitz

(57) ABSTRACT

An composition exhibiting a desired value of magnetic susceptibility, which can be used to fabricate components in an NMR device, and method thereof, wherein the composition comprises a metal ion selected from the group consisting of $Gd^{+3}$, $Fe^{+3}$ and $Mn^{+2}$ and an amorphous material using a ligand or chelating agent to solubilize the metal ion throughout the marphous material, wherein the magnetic susceptibility of the composition exhibits a desired value at cryogenic temperatures such as nearly zero susceptibility at temperatures at or below 77° K.

8 Claims, 2 Drawing Sheets

OTHER PUBLICATIONS

Dequing et al, "Photoluminescent and Electroluminescent properties of Ligand Emitting Y3+, La3+, Gd3+ and Lu 3+ complexes," Abstract, J. RareEarths, 2004.2.*

Affronte et al, "Low Temperature thermodynamic properties of molecular magnetic chains," Physical Review-B, 1999, 59(9), 6282-6293.*

Article by Paschalidis, et al, entitled "Synthesis, characterization and spectra of landthanide(III) hydrazone complexes The X-ray molecular structures of the erbium(III) complex and the ligand", published in Polyhedron, vol. 19, No. 26-27, Dec. 15, 2000.

Book by Ashcroft, NW and Merwin, ND, entitled "Solid State Physics", published by Holt, Rinehart and Winston, 1976, Chapter 31, pp. 657-658.

* cited by examiner

LOW TEMPERATURE SUSCEPTIBILITY COMPENSATION

BACKGROUND OF THE INVENTION

The invention is in the general area of magnetic susceptibility compensation and more specifically relates to the problem of reduction of magnetic inhomogeneities in nuclear magnetic resonance apparatus.

DISCUSSION OF RELATED ART

This invention relates to an amorphous composition, which has improved low temperature magnetic compensation, method of producing same, and use thereof. Although reference will be made to epoxy as an exemplar material, this work is not so specifically limited.

A property of any material is its magnetic susceptibility, that is, the coefficient relating an applied magnetic field to the induced magnetic response of the material, as defined by the magnetization (induced magnetic moment or susceptibility)

$$M = \chi H_0 + S \qquad \text{Equ. 1}$$

Where $H_0$ is the magnetic environment or applied field, M is the magnetization and $\chi$ is the coefficient of magnetic susceptibility and S is a constant for applied field values well above the saturation field, that is, $H_0 \gg H_s$. It is more precise to define the coefficient $\chi$ as $$\partial M / \partial H_0 = \chi$$

through recognition that there is a significant temperature dependence as well as non-linearities associated with the strength of the applied field. It should also be understood that the saturation field is a property of materials generally because magnetization induced by an external field does not increase without limit in response to an increased value of said field. Rather, the magentization M, or magnetic moment, saturates at an external field intensity characteristic of the material for a temperature T.

Values of $\chi > 0$ are said to be paramagnetic and values less than 0 are diamagnetic. The vector character of the quantities M and $H_0$ need not be considered for the purposes of this work. It is readily appreciated that a non-zero value for $\chi$ means that in proximity to the material, the actual field will include the applied field and a contribution from the magnetic moment (M) of the material. This local effect can contribute inhomogeneities (gradients) to the field and therefore disturb magnetic resonance measurements for which the magnetic environment must be extremely uniform and any gradients are precisely controlled in time direction and magnitude. In what follows, the term "susceptibility" will be understood in the context to refer to the coefficient of susceptibility $\chi$, or the physical effect, M, as the context may indicate. This distinction is critical to understanding the distinction of the invention over the prior art. It is clear that in a magnetic field $H_0$, where the value of M for a given structure is equal to the value of M for the surrounding medium, there is no magnetic gradient and the structure is indistinguishable (magnetically). At ordinary temperatures and field magnitude well above saturation, equation 1 is a simple linear relationship for (non-ferromagnetic) materials. By matching the coefficient of susceptibility $\chi$, for two materials, for example a structure and the surrounding medium, the prior art achieved the desired result over a range of values for the magnitude of the field $H_0$. The present invention matches the value of M for a given field $H_0$ without regard to the coefficients of susceptibility for the respective materials. Although the generic term "susceptibility compensation" is commonly employed, it is important to recognize this distinction In the art, such as encountered in high resolution applications of Nuclear Magnetic Resonance (NMR), materials having a very low, or nearly zero magnetic susceptibility are desired for structures proximate the sample space where magnetic inhomogeneities distort the magnetic field environment. Undesired magnetic susceptibility of materials forming structures subject to a magnetic environment has been compensated using a variety of methods, including use of different materials intimately related (as with coatings), combined metal mixtures, gaseous combinations, and liquids, and generally as compensating agents. It should be recognized that these techniques often take the form of reduction of magnetic susceptibility discontinuities between different materials, or the achievement of a desired value for the magnetic susceptibility M, of some object.

In instances where the perturbations due to nonzero susceptibility persist, magnet shim coils are commonly used to provide a controlled incremental magnetic field to compensate for magnetic inhomogeneities. The successful practice of shim coil compensation requires the perturbations be weak and slowly varying near the active sample volume of the NMR probe. For example, U.S. Pat. No. 3,091,732 is directed to eliminating undesired magnetic field gradients across a sample space caused by paramagnetic or diamagnetic discontinuities of members located in the vicinity of the sample space. This is accomplished by combining selected proportions of paramagnetic and diamagnetic materials to match the magnetic susceptibilities.

Another example of prior art is U.S. Pat. No. 5,545,994, which discloses adding a mixture of two fluids of different specific magnetic susceptibilities and at respective partial pressures to a sample space to achieve a desired volume magnetic susceptibility which matches the volume magnetic susceptibility of the solid component.

A further example is U.S. Pat. No. 5,684,401 which describes compensation of magnetic susceptibility variation using a perfluorinated hydrocarbon as a matching medium enveloping a microcoil to minimize magnetic susceptibility induced variations in the Bo magnetic field.

In all of these examples, the practice required little or no knowledge of the nonlinear properties of magnetism. This is a result of the application of the art to situations of small susceptibility and environments at or above room temperature.

In most practical situations structural members of a magnetically sensitive apparatus exhibit "invisibility" in the magnetic sense from the environment of such structural members. Accordingly, matching the magnetic properties of such structural members to their environment contributes to the magnetic homogeniety of the region occupied by those structural members and their environment. If the environment is vacuum, (or air), the magnetic susceptibility thereof is zero, (or nearly zero). It is therefore desired to so modify the structural member that its magnetic susceptibility is likewise zero. If the environment is not vacuum or air, but some other material exhibiting magnetic susceptibility $M_0$, it is desired to modify the structural member to similarly have susceptibility $M_0$. In this work, it should be understood from the context that a null value for M is merely a particular value selected for the above purpose.

In the fabrication of magnetic components, epoxy is often used as a bonding agent for cementing substances because of its properties unrelated to magnetic susceptibility. The magnetic susceptibility of epoxy in combination with its use in small, localized areas near the NMR sample space require that this material be compensated. Typical epoxies in common commercial use are characterized by diamagnetic coefficient $\chi$ in a range $-1$ to $-0.5 \times 10^{-6}$ cgs units. The usual practice for susceptibility compensation is to follow the art mentioned above, and combine or mix a paramagnetic material into the epoxy such that the susceptibilities appreciably cancel. This practice becomes difficult at cryogenic temperatures due to the non-linear and poorly characterized magnetic behavior of many paramagnetic materials at low temperatures.

In the present work, reference to an epoxy is understood as a particularly useful example of the invention and does not exclude other amorphous materials from the scope of the invention.

Accordingly, in the art, there exists a need for a material or composition that exhibits a desired value of magnetic susceptibility. It is particularly useful to achieve a nearly zero magnetic susceptibility at low ("cryogenic") temperatures. It is appropriate to identify an upper limit for a cryogenic temperature by the condition where the alignment energy of the molecular magnetic moment in an applied field $H_0$ for the composition approaches a value comparable to the thermal energy, i.e., $$\mu_g H_0/kT \approx 1$$

where $\mu_g$ is the elemental (molecular, or atomic) magnetic moment, k is the Boltzman constant and T is the absolute temperature.

The composition of the invention is intended for use at a cryogenic temperature as a structural material itself, or as a bonding or cementing substance. In this work, "low temperature" is identified with cryogenic temperatures generally. Practical applications commonly occur at or below about 77° K and this is often cited herein as an exemplary cryogenic temperature.

SUMMARY OF THE INVENTION

Magnetic resonance instrumentation functions in an environment of a homogeneous magnetic field and/or precisely controlled field gradients. Field homogeneity is disturbed by any object within the field characterized by a value of magnetic susceptibility differing from the corresponding value for the environment of the object. Therefore, the control of the magnetic homogeneity of a material allows structures of such material to be essentially indistinguishable by magnetic means. In most contexts the relevant environment is vacuum or air, e.g., magnetic susceptibility, M=0 and $\chi$=0 (very nearly so for air). The present invention is directed to providing an amorphous material, such as an epoxy that is matched to a selected value (ordinarily a null) of susceptibility, and moreover, to maintain this value while subject to a selected magnetic field intensity at range of cryogenic temperatures, and in another embodiment, to achieve this value at a particular cryogenic temperature.

One object of the invention is to modify the magnetic susceptibility property of an epoxy, or similar amorphous composition which is usable as a structural material itself and/or as a bonding material, and which has nearly zero magnetic moment at cryogenic temperatures and at the magnitude of the magnetic fields characteristic of the NMR apparatus.

A further object is to modify the magnetic susceptibility property of epoxy or similar amorphous material by mixing a metal ion selected from the group consisting of gadolinium ($Gd^{3+}$), tri-valent iron ($Fe^{+3}$) and di-valent manganese ($Mn^{+2}$) together with a ligand or chelating agent, into the epoxy (or similar amorphous material), whereby to achieve a desired value for the magnetic susceptibility at a cryogenic temperature.

Another object is to provide an NMR apparatus which uses an epoxy composition, such as for cementing magnetic materials, which composition has nearly zero magnetic moment at low temperatures.

A still further object is to provide an epoxy (or similar amorphous) composition comprising a metal ion selected from the group consisting of $Gd^{3+}$, $Fe^{+3}$, and $Mn^{+2}$ which is solubilized in the epoxy using a chelating agent or ligand so that the magnetic susceptibility of the resulting composition has nearly zero magnetic moment at temperatures of 77° K and lower.

The foregoing and other objects are attained by the invention which encompasses an epoxy (or similar amorphous) composition which includes a metal ion selected from the group consisting of $Gd^{3+}$, $Fe^{+3}$ and $Mn^{+2}$ dissolved in the epoxy using a chelating agent or ligand, wherein the magnetic susceptibility, or magnetic moment at desired applied field strength, of the resulting epoxy composition is nearly zero at low temperatures of 77° K or less. Thus, the invention can be used to bond or cement together magnetic materials or be used as a structural material itself, without requiring any further additional compensating material to compensate for undesired magnetic susceptibility.

The inventive composition comprises a metal ion selected from the group consisting of $Gd^{3+}$, $Fe^{+3}$ and $Mn^{+2}$ solubilized in the epoxy (or similar amorphous) using a chelating agent or ligand, such as Lg; as described below. The epoxy may be epoxy resin and its curing agent, and the composition includes other elements as described below. The metal ions used in the invention exhibit advantageous magnetic susceptibility properties at low temperatures because of their nearly symmetrical ground states for orbital angular momentum, i.e. L=0, and simplicity in electrical configuration so as to fit the Brillouin-Langevin equation over a wide range of field strength and temperature.

Thus, use of the inventive composition is especially advantageous in the design formulation of magnetic materials that have nearly zero magnetic susceptibility at low temperatures. For example, magnetic materials used in NMR apparatus are desired to have low or nearly zero magnetic susceptibility, especially at low temperatures, for greater sensitivity, reliability and reduced noise. The epoxy composition of the invention can be used, advantageously, to fabricate for example by bonding, magnetic material parts, with the additional advantage that the invention epoxy composition does not add further magnetic susceptibility at low temperatures. Thus, structural components for use in an NMR magnetic field, fabricated using the inventive composition would have total magnetic moment of nearly zero at low temperatures. Alternatively, these parts are fabricated to exhibit a vanishing induced magnetic moment at a specific (relatively high) applied magnetic field. In that manner, adverse effects due to unwanted magnetic susceptibility or induced magnetic moment would be further reduced.

The invention comprehends a composition as described herein for exhibiting desired susceptibility at cryogenic temperatures, the method of preparing such composition and an NMR apparatus employing such composition. The modified amorphous composition of the invention is accomplished by tailoring the magnetic properties of a selected amorphous material, principally an epoxy or a plastic or glass through an appropriate admixture of a selected metal ion selected from the group consisting of $Gd^{3+}$, $Fe^{3+}$, and $Mn^{2+}$. The preparation of the composition entails achieving solubility of the selected metal ion into the selected amorphous matrix. This is accomplished by incorporation of the selected ion into a chelating agent or ligand that exhibits solubility with the amorphous matrix. The tailoring of the magnetic susceptibility property is directed to achieving a fixed value of the induced magnetization of the composition at cryogenic temperature in respect of another material, where that other material ordinarily comprises the environment for the amorphous composition of the invention. The composition is employed in proximity to the sensitive volume of an NMR apparatus. An especially useful composition is an epoxy where the bonding properties of the epoxy are required for structural purposes.

One aspect of the invention is an amorphous composition for magnetic susceptibility compensation at cryogenic temperatures to which there is added a metal ion selected from the group consisting of $Gd^{+3}$, $Fe^{+3}$ and $Mn^{+2}$ and a ligand or chelating agent whereby the resulting composition is characterized by having nearly zero magnetic susceptibility at cryogenic temperatures.

A second aspect of the invention is a method of preparing a susceptibility compensated amorphous composition for use at low temperatures, comprising the steps of mixing a metal ion selected from the group consisting of $Gd^{+3}$, $Fe^{+3}$ and $Mn^{+2}$ with such amorphous material and a chelating agent or ligand so that the resulting composition has a selected magnetic susceptibility at low temperatures.

A third aspect of the invention is an NMR device utilizing a magnetic material fabricated to produce an amorphous composition to which there has been added a metal ion selected from the group consisting of $Gd^{3+}$, $Fe^{+3}$ and $Mn^{+2}$, and a ligand or chelating agent and having the property of a selected value of magnetic susceptibility at cryogenic temperatures.

The invention is further described below for illustrative purposes and such description is not to be considered to be limiting in any way.

DETAILED DESCRIPTION OF THE PREFERRED EMBODIMENTS

In an NMR apparatus, for example, use is made of a magnet, and most often, a superconducting magnet having a bore. The magnet bore may support properties producing certain disadvantageous effects, such as magnetic residual fields, electrical noise, inhomogeneity, etc, due to magnetic susceptibility discontinuity of materials comprising, or supported within the bore. By using selected materials having selected values of magnetic susceptibility, the magnetic susceptibility discontinuity effect can be reduced.

In fabricating the NMR apparatus, epoxy resin is often used as a bonding or cementing agent to join together components of the magnet and/or of the NMR probe supported within the bore. Even though used in small quantities, epoxy resin has a non-zero value of magnetic susceptibility.

The invention encompasses an epoxy composition which has nearly zero magnetic susceptibility and/or induced magnetic moment, especially at cryogenic temperatures and high applied field intensity, such as at or below 77° K and of the order of tens of tesla.

Figure 1:
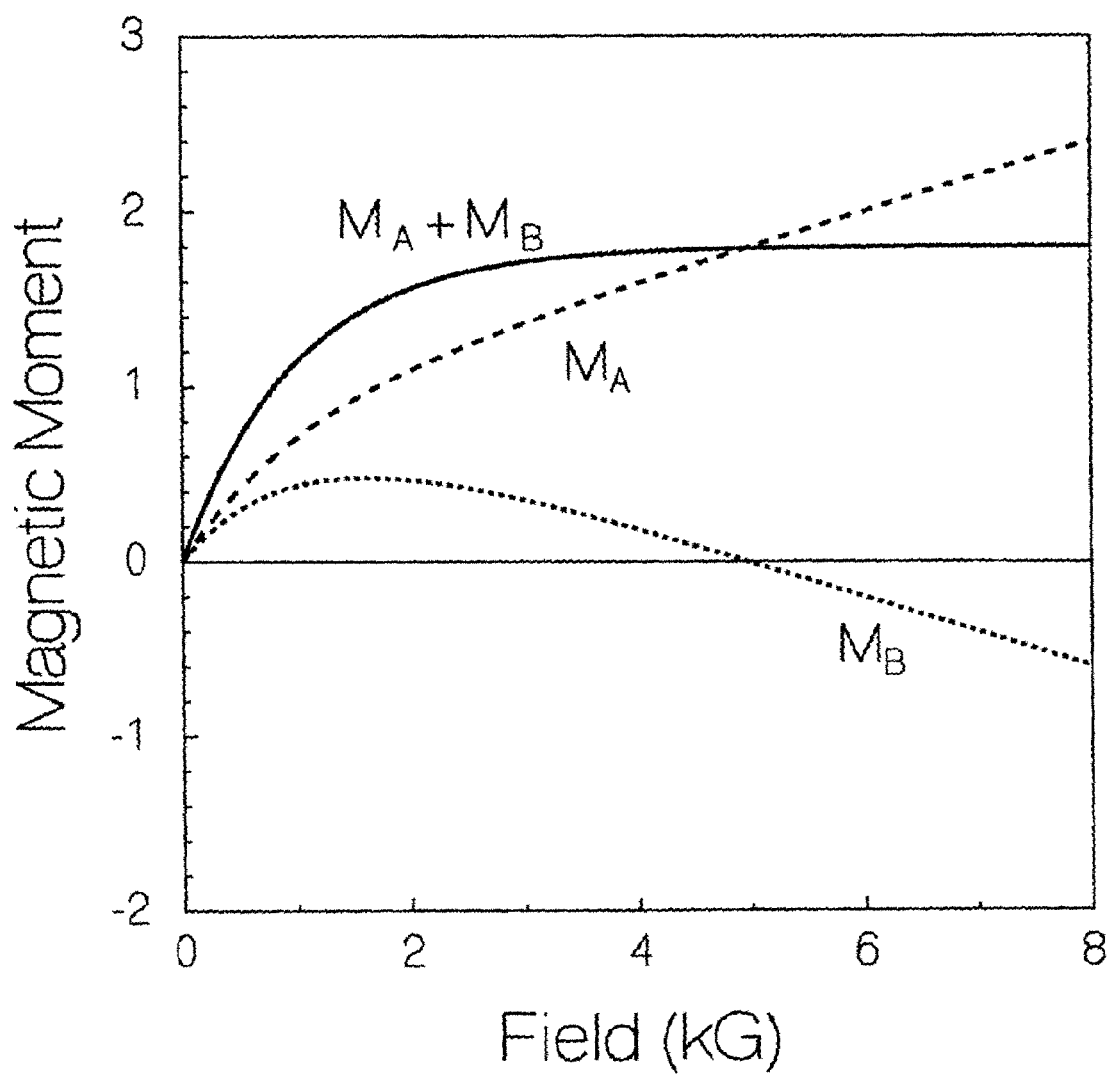
FIG. 1 is a schematic graphical explanation for the process of susceptibility matching to a desired value.

FIG. 1 shows the general methodology of susceptibility matching, that is matching the value of the induced magnetic moment of one material to another (the latter usually being the environment of the former). The two substances, A and B, exhibit respective (induced) magnetic moments as a function of applied field. An appropriate combination of the substances produces a resultant selected value of $\partial M/\partial H_0 \approx 0$ over a wide range of field beyond a low field region. It should be apparent that the value of M, the induced moment, may be independently selected. A value of zero for M is appropriate to the case where the magnetic environment of the subject material is zero. This is the usual situation where the bore of an NMR magnet is vacuum or air and the subject material is disposed within that bore. (It should be recognized that an NMR magnet bore or field region generally may be enveloped by some other material, a fluid perhaps, exhibiting some non-zero applied moment M or susceptibility coefficient $\chi$. The present discussion is directed to matching the induced moment to a selected value at cryogenic temperatures.

Figure 2:
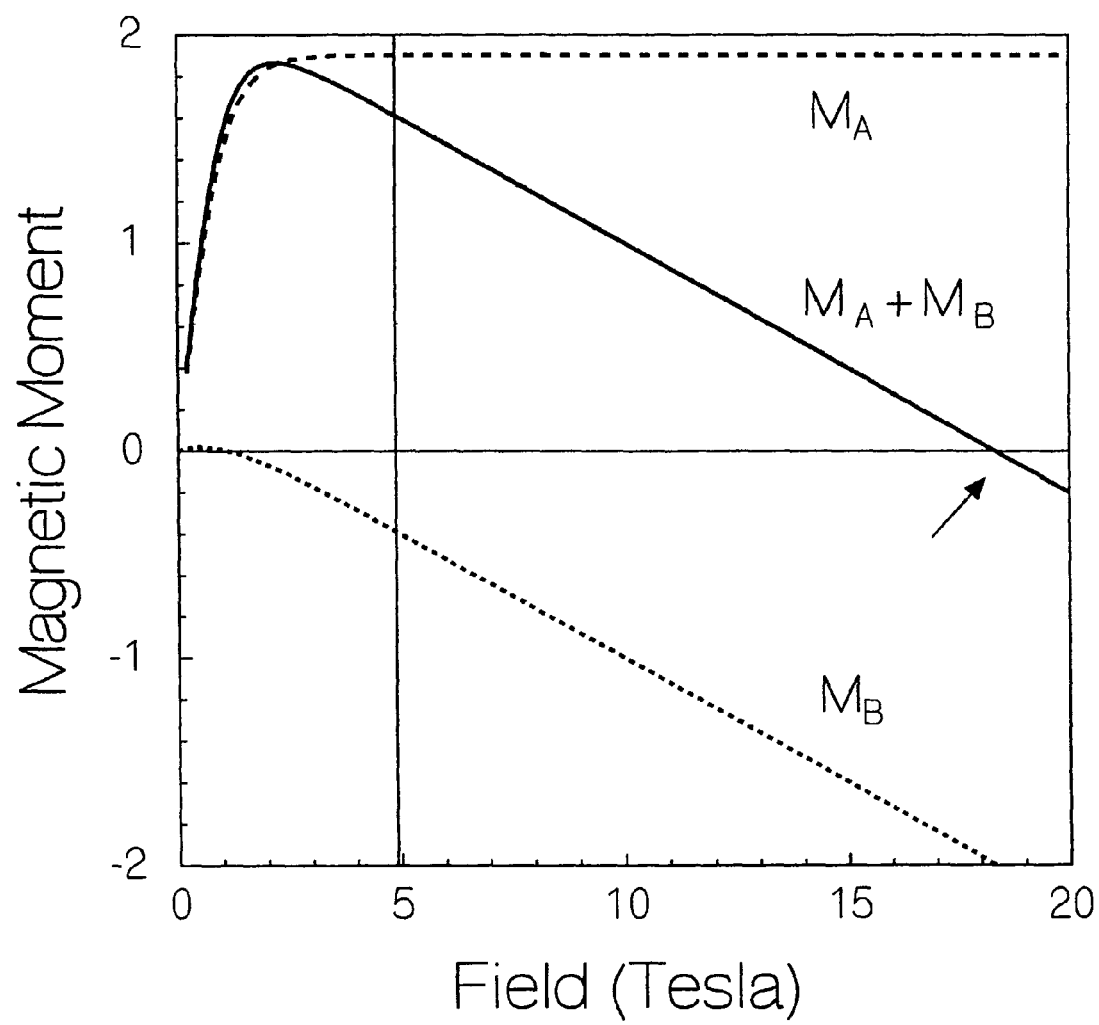
FIG. 2 is a schematic graphical explanation of field specific magnetic moment nulling.

FIG. 2 represents a different application of material property tailoring of effective magnetic moment of a material to exhibit a linear dependence and to vanish at a particular value of applied magnetic field. A first material, symbolically $M_A$ is saturated above some field strength, here shown as about 5 Tesla. A second material, $M_B$ exhibits a diamagnetic susceptibility above the same field value. An appropriate admixture, $M_A+M_B$ of the two materials will provide a null for the magnetization of the composite material, at a narrow field value. Where the constituent materials closely follow the B-L equation, that critical field value can be calculated and the composite can be so designed to yield this result. Note that the susceptibility $\chi$ is neither nulled nor matched to any other susceptibility coefficient for this embodiment of the invention.

Returning now to FIG. 1, under normal conditions, prior art epoxy compositions have some undesired magnetic properties at various temperatures including low temperatures. For the sake of example, it may be noted that common epoxies in combination with their curing agents have bulk coefficients of susceptibility characteristic of organic compounds. That is, these materials, in general are diamagnetic with a coefficient of susceptibility of the order $-1 \times 10^{-6}$ cgs units. A null in the magnetic susceptibility of the inventive epoxy composition can be produced at temperatures at or below 77° K in the presence of a saturating magnetic field $H_0$ when a metal ion selected from the group consisting of $Gd^{3+}$, $Fe^{+3}$ and $Mn^{+2}$ is chelated or solubilized with epoxy, using a ligand or chelating agent to form the desired molecular structure. As further discussed below, other amorphous matrices may be employed in place of epoxy, where desired.

Other metal ions, e.g., holmium, have been investigated in the course of this work. When appropriately chelated and introduced with an epoxy resin, these have produced low magnetic susceptibility at higher temperatures where the temperature dependence of magnetic susceptibility follows Curie's Law. Thus, for cryogenic temperatures, such as below or at 77° K, these other metal ions have proven unsatisfactory for producing the desired magnetic susceptibility properties. The epoxy composition could be used advantageously with those other selected ions which, when subjected to such low temperatures produced the total effect of nearly zero magnetic susceptibility, M, for the epoxy composition of the invention. Thus, further compensation is not needed to obtain the desired uniform magnetic environment within the bore of the NMR apparatus.

This novel discovery of the null in magnetic susceptibility of the epoxy composition of the invention, as chelated with a metal ion selected from the group consisting of $Gd^{3+}$, $Fe^{+3}$ and $Mn^{+2}$ using a chelating agent or ligand, enables use of such inventive composition to produce an unexpected and outstanding result. The operation of shimming the magnetic field, (modifying the prevailing magnetic field with locally applied field components) is substantially reduced where the present invention is employed because magnetic irregularities of the structure have been substantially reduced or eliminated.

It is known that certain metal ions ($\Sigma^{+n}$) are paramagnetic, i.e. magnetic susceptibility $\chi$ is greater than zero, and can be mixed with epoxy resin produce a null in magnetic susceptibility. That is:

$$\chi_\Sigma V_\Sigma + \chi_R V_R = 0$$

wherein $\chi_\Sigma$ is the magnetic susceptibility of the metal ion, $V_\Sigma$ is the volume of the metal ion, $X_R$ is the magnetic susceptibility of the epoxy resin, and $V_R$ is the volume of the epoxy resin. This is the essence of the manner of susceptibility matching practiced in the prior art Generally, the magnetic susceptibility coefficient of the metal ion depends on the temperature, i.e. $\chi_\Sigma(T)$. Thus, compensation is achieved only at one temperature for a given volume of the metal ion $V_\Sigma$. This holds for a wide range of magnetic fields.

For most materials at or near room temperature subject to a magnetic field above the saturation point of such material, the magnetic moment per unit volume can be quantitatively expressed as $M=\chi(T)H_0+S$, wherein $H_0$ is the applied magnetic field, $\chi(T)$ is the magnetic susceptibility coefficient which is a function of temperature T and S is a constant.

To obtain cancellation of induced magnetic moments of two materials, A and B, these materials are selected so that $M_A=V_A\chi_A(T)H_o+S_A$ and $M_B=V_B\chi_B(T)H_o+S_B$, that is $V_AM_A+V_BM_B=0$, and the magnetic moments of the two materials cancel each other at a particular temperature T. The value of zero for the combination of the two materials is selected to match a surrounding medium such as vacuum or air, which has zero (or nearly zero) magnetic moment. A value for M other than zero, e.g., M', would be appropriate to a surrounding medium for which M' is the magnetization value under the same conditions.

At ambient temperatures, $S_A$ and $S_B$ are both very small as compared to $\chi_A(T)H_0$ and $\chi_R T)H_o$, and then $V_A\chi_A(T)=-V_B\chi_B(T)$. In that case, as shown in FIG. 1, there is cancellation of the magnetic susceptibilities, which are independent of magnetic field.

At cryogenic temperatures, when $S_A$ and $S_B$ are large, or when the magnetic moments $M_A$ and $M_B$ is a non-linear function of magnetic field, the magnetic susceptibility M effective of the combination cannot be matched to the desired value for all field strengths. For an instrument operating at a fixed field strength, this presents no practical limitation.

At low temperatures, paramagnetic ions are non-linear in their magnetic properties and the saturation point is temperature dependent. At high temperatures, paramagnetic ions have a susceptibility coefficient that varies inversely with temperature, that is $\chi(T)=C/T$ wherein C is a constant. Thus, prior art susceptibility matching is easily adapted to a range of temperatures in those temperature regions where Curie's law holds.

The situation is more complex for cryogenic temperatures, that is at 77° K or less where the magnetic moment for atomic systems of simple symmetry follow the Brillouin-Langevin equation, rather than a simple linear dependence on $H_0$ through a simple susceptibility coefficient $\chi$. At low temperature and high fields the magneticmoment, M, of an ion will be a non-linear function of magnetic field and temperature. In the art of susceptibility matching for applications to high resolution NMR, the actual operational magnetic field can be high, e.g., 20 Tesla. The behaviour of magnetic ions at this field strength is often impractical and expensive to directly measure. However, it was found that for certain classes of ions having a symmetric ground state orbital angular momentum L=0, the magnetic behaviour closely follows the Brillouin-Langevin equation. Using this quantitative behaviour allows characterization at low magnetic fields with confident extrapolation to the very high magnetic fields used during NMR measurements, at cryogenic temperatures, such as at or below 77° K.

The metal ions which meet the foregoing criteria were determined to be gadolinium ($Gd^{3+}$), iron ($Fe^{+3}$), and manganese ($Mn^{+2}$). These metal ions of the invention are simple in electrical configuration and follow the Langevin behaviour so that at low temperatures magnetic behaviour is predictable.

A discussion of the characteristics of the metal ions of $Gd^{3+}$, $Fe^{+3}$ and $Mn^{+2}$ is disclosed, for example, in Ashcroft and Mermin, "Solid State Physics", 1975, Rinehart, Holt and Winston, Tables 31.3 and 31.4, made a part hereof.

The metal ions of this invention, when integrated into, dissolved into, or mixed with other elements and/or compounds can readily be matched in magnetic susceptibilities with air or vacuum. A preferred embodiment is the case where the metal ion is selected from the group consisting of $Gd^{3+}$, $Fe^{+3}$ and $Mn^{+2}$ and is chelated or solubilized into epoxy resin or other material so that the resulting composition has nearly zero magnetic moment, M. The epoxy resin when chelated with the metal ion of the invention can be used as a bonding material for other magnetic materials so that the resulting structure is almost totally free of undesired magnetic susceptibility. The inventive composition can be used also for structural purposes.

In the prior art described in U.S. Pat. No. 3,091,732, a metal ion and epoxy resin formed a mechanical mixture. For example, a metal oxide ($MnO_2$) was used in a finely powdered state and dispersed finely and uniformly in the epoxy resin. However, such mixture does not provide a nearly zero magnetic susceptibility at low temperatures, and hence was not satisfactory.

In contrast, the present invention prescribes that a metal ion selected from the group consisting of $Gd^{3+}$, $Fe^{+3}$ and $Mn^{+2}$ is chelated with a coordination donor ligand (called "Lg") so as to render the metal ion soluble in the epoxy. The ligand, Lg, or chelating agent, has sufficient polar or non-polar characteristics to be soluble in the epoxy.

$Gd(ACAC)_3$, that is Gd(III)acetylacetonate, and $Gd(mthd)_3$, that is, Gadolinium tris 2,2,6,6-tetramethyl-3,5-heptanedionate, are two exemplary compounds that have been successfully used in the invention. These compounds preferably include the Gd metal ion. Alternatively, the $Fe^{+3}$ and $Mn^{+2}$ metal ion are advantageous in a greater range of magnetic fields and at temperatures of 77° K and lower, although their solubility in epoxy resin may not be perfect.

For simple ions, the magnetic moment obeys the Brillouinn-Langevin equation ("B-L equation") which is discussed in detail in the above recited Ashcroft and Mermin reference "Solid State Physics" and which is made a part hereof by reference. This non-linear behaviour of the magnetic susceptibility of the above mentioned ions originate in the fixed magnitude of the atomic magnetic moment, and as well in the saturability of the susceptibility. A balancing of magnetic moments from the ion and resin at all temperatures and magnetic fields is difficult in the prior art.

However, if the metal ion follows the B-L equation, formulations can be used in which the magnetic moments cancel at specified magnetic fields and temperatures. For example, for magnetic fields above a particular value at a given temperature, it can be arranged that $$M_{ion}(\text{saturated}) + \chi_R H_0 \cong 0$$

where M is the magnetization (or magnetic moment per unit volume, or simply "induced magnetic moment") and $H_0$ is an applied external magnetic field and $\chi_R$ is the magnetic susceptibility of a selected epoxy resin.

In addition to the use of the inventive epoxy composition as a bonding or cementing material for fabrication of components in a magnetic environment, the epoxy composition of the invention has other advantageous applications, such as for structural uses. For example, the inventive composition can be used to provide complete support of inserts (probe components), as supporting structures, as potting for structures, etc, as used in NMR apparatus. In such applications, there are limitations resulting from dielectric loss and NMR signal background levels, characteristic of room temperature epoxy resin compositions. At cryogenic temperatures, such parasitic limitations are reduced in effect. Also, the NMR background noise is reduced because the NMR relaxation time becomes long. Further, the dielectric loss is reduced due to slowing of the electric dipole reorientation.

Moreover, the principles of the invention are applicable with compositions other than epoxy resins, such as plastics, glass, resins of other matrices, etc. An example is the addition of $Gd_2O_3$ in borosilicate glass. The usage of the inventive composition is advantageous where cryogenic temperatures, such as 77° K or lower, are used, since it is at these lower temperatures that the inventive composition may be easily manipulated to exhibit nearly zero magnetic susceptibility. Accordingly, the invention is applicable for bonding or cementing materials in a magnetic environment, as well as for the structures themselves.

The symbol "Lg" is used herein for any ligand or chelating agent, and all such terms may be used interchangeably herein and are to be understood as such. In one experiment using Gd for modifying an epoxy, 2,2,6,6-tetramethyl-3,5-heptanedionate was selected for the solubilizing ligand. A solubilizing ligand for use herein should more or less conform to the rules of solubility, namely, that likes dissolve likes, such as polar solvents dissolve polar solutes, and non-polar solvents dissolve non-polar solutes. Also, although it is preferred herein to use epoxy and/or epoxy resin, it is to be understood that the invention is not limited thereto and can be readily extended to various amorphous materials such as resins of various types, and other materials, such as glass, plastics, etc. The above materials are limited to a class capable of maintaining the chelated modifying ion in solution at the low temperatures contemplated. The ligand is bound to the metal ion and is connected to the host material. In a sense, the ligand surrounds the metal ion and is solubilized in the host material, such as the example of the epoxy. It is to be understood that any ligand or chelating agent or solubilizing agent that binds the metal ion and effects solubility in the host material, such as the epoxy resin, is within the scope of the invention. That is, the ligand binds the metal ion, which forms a coordination complex with the host material. Another way to consider this invention is as a chelating process wherein the metal ion is attached to neighboring host material atoms by at least two coordination bonds in such a manner as to form a closed chain.

The foregoing is descriptive of the invention. Numerous extensions and modifications thereof would be apparent to the worker skilled in the art. All such extensions and modifications are to be considered to be within the spirit and scope of the invention.

What is claimed is:

1. In a magnetic resonance apparatus for study of a sample, said apparatus comprising the environment surrounding said sample wherein said environment is characterized by a first value of magnetic susceptibility, an amorphous composition comprising an amorphous matrix, a metal ion selected from the group consisting of $Gd^{3+}$, $Fe^{+3}$ and $Mn^{+2}$, and a ligand, said composition having a value of magnetic susceptibility substantially equal to said first value at cryogenic temperatures.

2. The magnetic resonance apparatus of claim 1, wherein said ligand binds said metal ion and effects solubility thereof in said amorphous matrix.

3. The magnetic resonance apparatus of claim 2, wherein said metal ion is $Gd^{3+}$ and is in the form of $Gd(Lg)_3$ or, in the alternative, in the form of $Gd(ACAc)_3$, wherein Ac is acetylacetonate, and Lg is 2,2,6,6-tetraniethyl-3, 5-heptanedionate.

4. The magnetic resonance apparatus of claim 1, wherein said amorphous matrix comprises epoxy resin.

5. The magnetic resonance apparatus of claim 1, wherein said composition is characterized by said value of induced magnetization equal to that of another selected material at said cryogenic temperatures for exposure of both said materials to said applied magnetic field.

6. The magnetic resonance apparatus of claim 1, wherein said value of magnetic susceptibility is zero.

7. The magnetic resonance apparatus of claim 1, wherein said selected value of magnetic susceptibility is reached at a selected temperature below substantially 77K.

8. The magnetic resonance apparatus of claim 1, wherein said metal ion is $Gd^{+3}$.

* * * * *